(12) United States Patent
Ishitsuka et al.

(10) Patent No.: US 11,268,841 B2
(45) Date of Patent: Mar. 8, 2022

(54) SEMICONDUCTOR ELEMENT AND FLOW RATE MEASUREMENT DEVICE USING SAME

(71) Applicant: Hitachi Automotive Systems, Ltd., Hitachinaka (JP)

(72) Inventors: Norio Ishitsuka, Tokyo (JP); Yasuo Onose, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 133 days.

(21) Appl. No.: 16/771,879

(22) PCT Filed: Aug. 6, 2018

(86) PCT No.: PCT/JP2018/029348
§ 371 (c)(1),
(2) Date: Jun. 11, 2020

(87) PCT Pub. No.: WO2019/159394
PCT Pub. Date: Aug. 22, 2019

(65) Prior Publication Data
US 2021/0072059 A1 Mar. 11, 2021

(30) Foreign Application Priority Data
Feb. 16, 2018 (JP) .............................. JP2018-025641

(51) Int. Cl.
*G01F 1/692* (2006.01)
*B81B 7/00* (2006.01)
(52) U.S. Cl.
CPC ............ *G01F 1/692* (2013.01); *B81B 7/0006* (2013.01); *B81B 2201/0214* (2013.01);
(Continued)

(58) Field of Classification Search
CPC .............................. G01F 1/692; G01F 1/6845; B81B 2203/0315
See application file for complete search history.

(56) References Cited

U.S. PATENT DOCUMENTS 6,631,638 B2 * 10/2003 James .................... G01F 1/6845
73/204.26
2007/0231942 A1 10/2007 Vanha et al.
(Continued)

FOREIGN PATENT DOCUMENTS

JP 2000-310553 A 11/2000
JP 2012-202786 A 10/2012

OTHER PUBLICATIONS

International Search Report (PCT/ISA/210) issued in PCT Application No. PCT/JP2018/029348 dated Oct. 2, 2018 with English translation (two (2) pages).
(Continued)

*Primary Examiner* — Francis C Gray
(74) *Attorney, Agent, or Firm* — Crowell & Moring LLP

(57) ABSTRACT

Provided are a semiconductor device and a thermal type fluid flow rate sensor which suppress strain occurring in an aluminum film and suppresses disconnection due to repeated metal fatigue of the aluminum film. The semiconductor device and the thermal type fluid flow rate sensor of the present invention are configured so that the heights of a silicon film and an aluminum film satisfy D»D1 between a flow rate sensor part (immediately above a diaphragm end part) D and a circuit part (LSI part) D1.

18 Claims, 8 Drawing Sheets

(52) U.S. Cl.
CPC ............ *B81B 2203/0127* (2013.01); *B81B 2203/0315* (2013.01); *B81B 2207/07* (2013.01)

(56) References Cited

U.S. PATENT DOCUMENTS

| | | | |
|---|---|---|---|
| 2012/0240674 A1 | 9/2012 | Sakuma | |
| 2015/0219515 A1* | 8/2015 | Hayashi | G01L 9/0042 |
| | | | 73/384 |
| 2016/0107880 A1* | 4/2016 | Sano | G01P 15/09 |
| | | | 257/419 |
| 2016/0155927 A1* | 6/2016 | Kabasawa | H01L 41/113 |
| | | | 257/419 |
| 2019/0161347 A1* | 5/2019 | Classen | H04R 31/006 |
| 2019/0270640 A1* | 9/2019 | Ranacher | G02B 26/0833 |

OTHER PUBLICATIONS

Japanese-language Written Opinion (PCT/ISA/237) issued in PCT Application No. PCT/JP2018/029348 dated Oct. 2, 2018 (four (4) pages).

\* cited by examiner

SEMICONDUCTOR ELEMENT AND FLOW RATE MEASUREMENT DEVICE USING SAME

TECHNICAL FIELD

The present invention relates to a semiconductor element and a flow rate measurement device using the same.

BACKGROUND ART

At present, an air flow rate meter which is provided in an electronically controlled fuel injection device of an internal combustion engine such as an automobile and measures intake air is used. As a fluid flow rate sensor used in such an air flow rate meter, a thermal fluid flow rate sensor using a heating resistor has become the mainstream because it can directly detect mass air. Among them, a thermal type air flow rate sensor manufactured by MEMS technology using a semiconductor has attracted attention because it can reduce manufacturing cost and can be driven with low power.

Such a technique includes a technique described in PTL 1, for example. PTL 1 discloses a thermal type fluid flow rate sensor having a detector including a heating resistor provided on a semiconductor substrate and a circuit part (LSI part) provided on the semiconductor substrate and including a control circuit that controls the heating resistor.

CITATION LIST

Patent Literature

PTL 1: JP 2012-202786 A

SUMMARY OF INVENTION

Technical Problem

A thermocouple type fluid flow rate sensor using MEMS technology has a diaphragm structure. In the sensor that measures the flow rate of the air fluid, the diaphragm deforms due to the pressure by the air flow. The authors have found, through an examination, that when the diaphragm deforms, stress is repeatedly applied to the aluminum wiring at the diaphragm end part, causing metal fatigue, resulting in a possibility of breaking. The above problem is not mentioned in PTL 1, thereby leaving room for examination.

The present invention has been made in view of the above problem, and its object is to provide a thermocouple type fluid flow rate sensor which suppresses strain occurring in an aluminum film and suppresses disconnection due to repeated metal fatigue of the aluminum film.

Solution to Problem

In order to achieve the above object, a thermocouple type fluid flow rate sensor according to the present invention includes a semiconductor element including a semiconductor substrate having a cavity part, a laminate part laminated on the semiconductor substrate, and a thermocouple formed so as to cross an end part of a diaphragm part which is a region covering the cavity part of the laminate part, wherein the thermocouple has a silicon film and an aluminum film provided on the laminate part, the silicon film is provided on a substrate side relative to a neutral axis of the diaphragm part, and the aluminum film is provided on an opposite side to the substrate relative to the neutral axis in a part crossing the end part of the diaphragm part.

Advantageous Effects of Invention

According to the present invention, since a generated strain of an aluminum film, which is a metal film, can be suppressed, the aluminum film can be suppressed from breaking.

BRIEF DESCRIPTION OF DRAWINGS

FIG. 5 is a view

DESCRIPTION OF EMBODIMENTS

Figure 1:
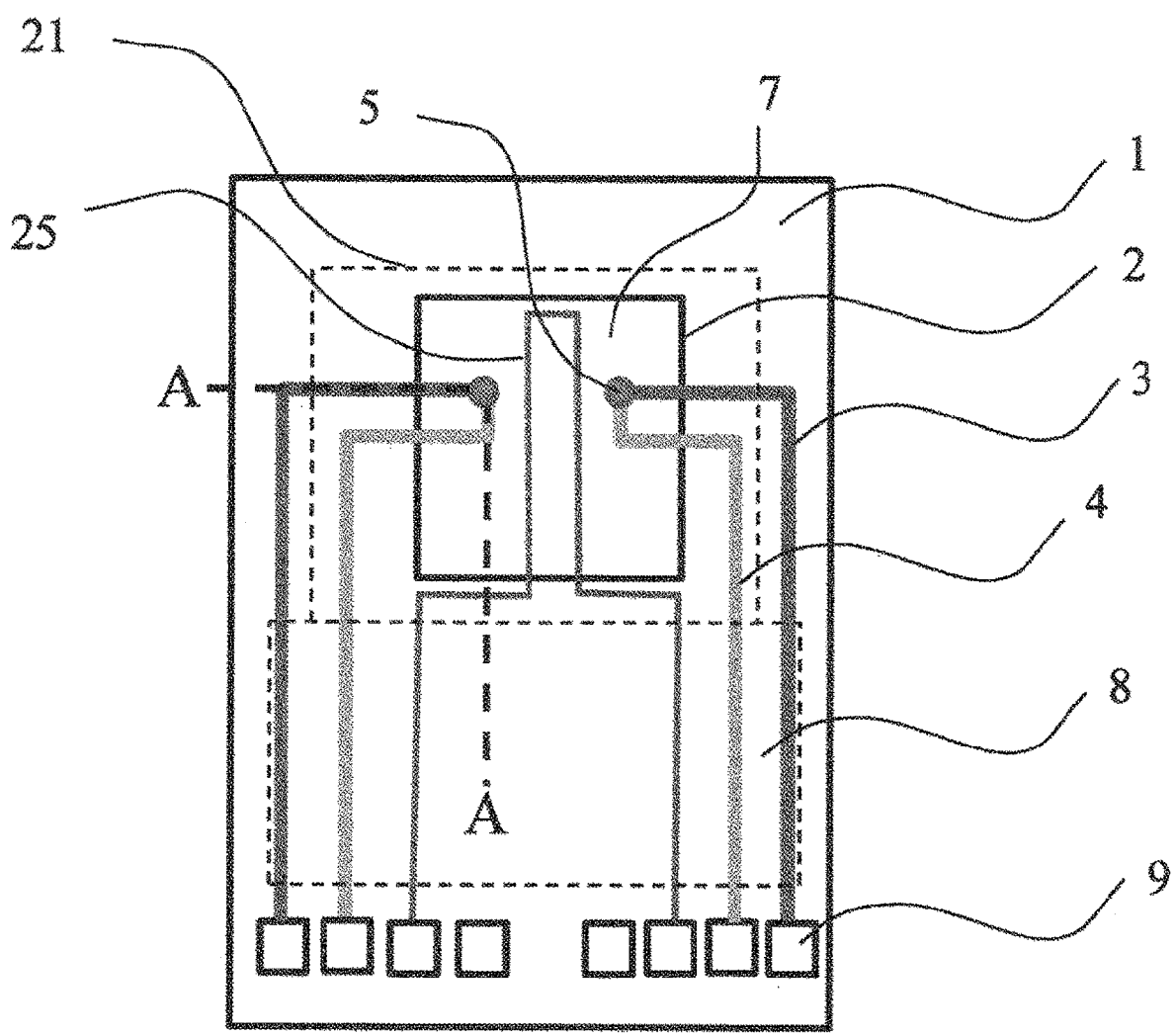
FIG. 1 is a plan view of a first embodiment.

Embodiments of the present invention will be described below with reference to the drawings.

First Embodiment

A first embodiment of the present invention will be described with reference to FIGS. 1, 2, 5, and 6.

A flow rate detection part 21 of a thermocouple type fluid flow rate sensor measures a flow rate by using electromotive force generated at a connection part 5 between a silicon film 4 and an aluminum film 3 that are formed on a diaphragm 7.

The thermocouple type fluid flow rate sensor includes a silicon substrate 1 and a diaphragm 7 formed so as to cover a cavity part provided in the silicon substrate 1, and a heating resistor 25 and a connection part 5 of the thermocouple arranged in the upstream and downstream of the heating resistor 25 are formed in the diaphragm 7. The present embodiment presents a structure in which one thermocouple is arranged in the upstream and downstream of the heating resistor to measure the temperature of the upstream and downstream of the heating resistor. However, a thermopile in which a plurality of thermocouples are connected may be adopted.

The diaphragm 7 is formed by laminating, on the silicon substrate 1, an insulator film such as a silicon oxide film, an aluminum film or a silicon film that form a thermocouple, and subsequently removing a part of a rear surface side of the silicon substrate 1 by dry etching or the like.

The aluminum film and the silicon film are formed so as to cross a diaphragm end part 2.

In the fluid flow rate sensor of the present embodiment, a circuit part 8 that performs processing of a signal from the flow rate detection part 21 is arranged.

Figure 2:
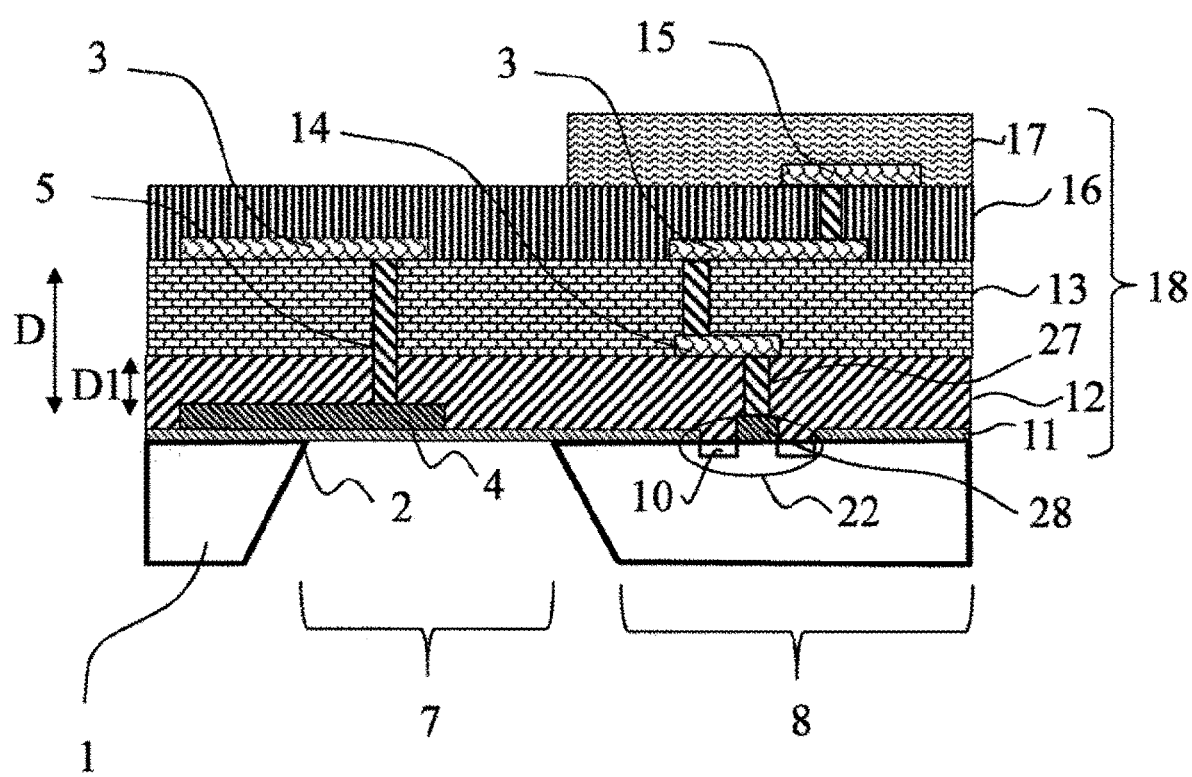
FIG. 2 is a cross-sectional view taken along the line A-A in the first embodiment.

Next, a cross-sectional structure will be described with reference to FIG. 2. In the fluid flow rate sensor, a transistor 22 serving as the circuit part 8 is arranged outside the diaphragm 7.

The fluid flow rate sensor includes the silicon substrate 1 in which the cavity part is formed, and a laminate part 18 formed on the silicon substrate. The laminate part 18 includes the silicon film 4 and the aluminum film 3 that form the flow rate detection part, and a silicon film 28 and an aluminum film 14 that form the circuit part. The silicon film is connected with the aluminum film 3 via the connection part 5 formed on the diaphragm 7. The silicon film 28 constituting the transistor is connected with a second aluminum film 14 via a connection part 27 formed in the circuit part 8. Examples of the connection parts 5 and 27 include through-holes.

Since a plurality of wiring layers exist in the circuit part 8 for integration and miniaturization, the aluminum films are formed of multilayers 3, 14, and 15. In order to insulate the wiring layers from each other, insulator films 12, 13, and are formed between respective layers. An example of a single layer is described as the insulator films 12 and 13, but a plurality of types of insulator films may be laminated, where a silicon oxide film, a silicon nitride film, or the like may be applied.

In the present embodiment, a height D of the connection part 5 formed on the diaphragm 7 and a height D1 of the connection part 27 formed on the circuit part 8 satisfy the relationship D>D1. In other words, the aluminum film 3 is arranged on the surface side relative to the aluminum film 14. Yet in other words, the distance D in the thickness direction between the aluminum film 3 and the silicon film 4 at the diaphragm end part 2 is larger than the distance D1 in the thickness direction between the transistor 10 and the aluminum film 14, which is formed substantially immediately above the transistor 10.

Figure 5A:
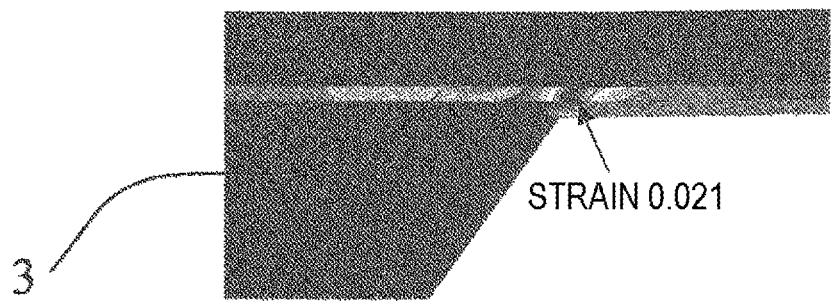
FIGS. 5A to 5C are views illustrating operations and effects of the present invention.
Figure 5B:
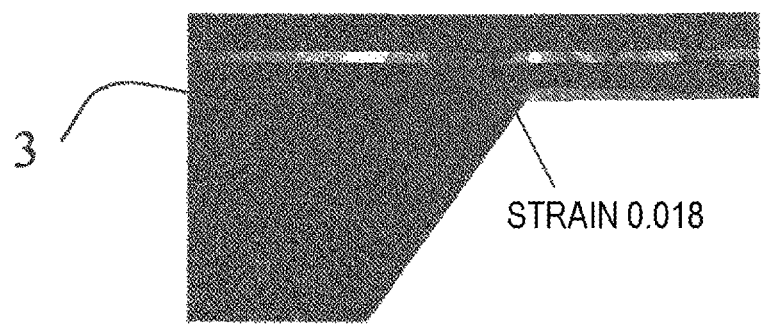
Figure 5C:
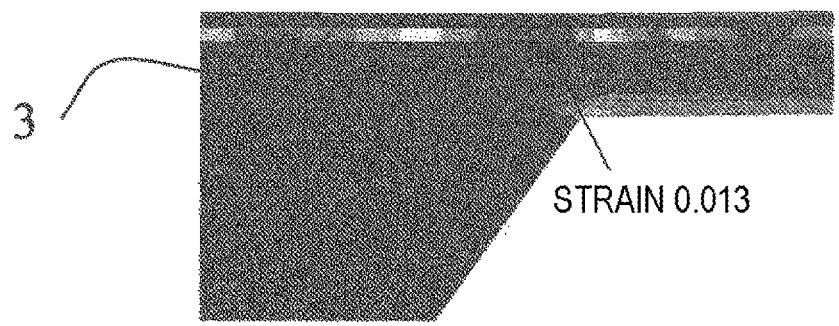

Next, the operations and effects of the present embodiment will be described. FIG. 5 presents an analysis of the stress (strain) of the aluminum film when the diaphragm is pressurized with the aluminum film arranged in a laminate film of a silicon oxide film and a silicon nitride film. The analysis conditions are a diaphragm width of 500 µm, a diaphragm thickness of 1 µm, and an applied pressure of 10 kPa, and the aluminum film is made of an elasto-plastic material. FIG. 5(a) presents a case where the aluminum film is closest to the diaphragm end part 2, FIG. 5(b) presents a case where the aluminum film is arranged in the middle of the diaphragm thickness, and FIG. 5(c) presents a case where the aluminum film is arranged near the surface. FIG. 5 indicates that the generated strain of the aluminum film is reduced by keeping the aluminum film away from the diaphragm end part 2. It is thought that such a result was obtained because the influence of the diaphragm end part due to the diaphragm bending deformation is reduced by keeping the aluminum film away from the diaphragm end part 2. Therefore, in order to suppress the strain generated due to the diaphragm deformation of the aluminum film, it is effective to keep the aluminum film away from the diaphragm end part 2.

In the present embodiment, the aluminum film 3 immediately above the diaphragm end part 2 of the flow rate detection part 21 is arranged on the surface side relative to the circuit part 8, thereby allowing the stress generated at the diaphragm end part 2 to be suppressed from affecting the aluminum film 3 and allowing the strain generated in the aluminum film 3 to be suppressed.

The silicon film 4 of the circuit part 8 and that of the flow rate detection part 21 are manufactured by the same process. If a thermal type fluid flow rate sensor having the circuit part 8 is designed without knowing the present knowledge, the aluminum film 3 and the aluminum film 14 are formed in the same layer as in the conventional case, and the height of the through-hole 5 and that of the through-hole 27 become the same. Therefore, the aluminum film 3 is closer to the diaphragm end part 2 as compared with the present invention, and hence the strain in the aluminum film generated when pressure is applied becomes larger than that in the present embodiment.

Figure 7:
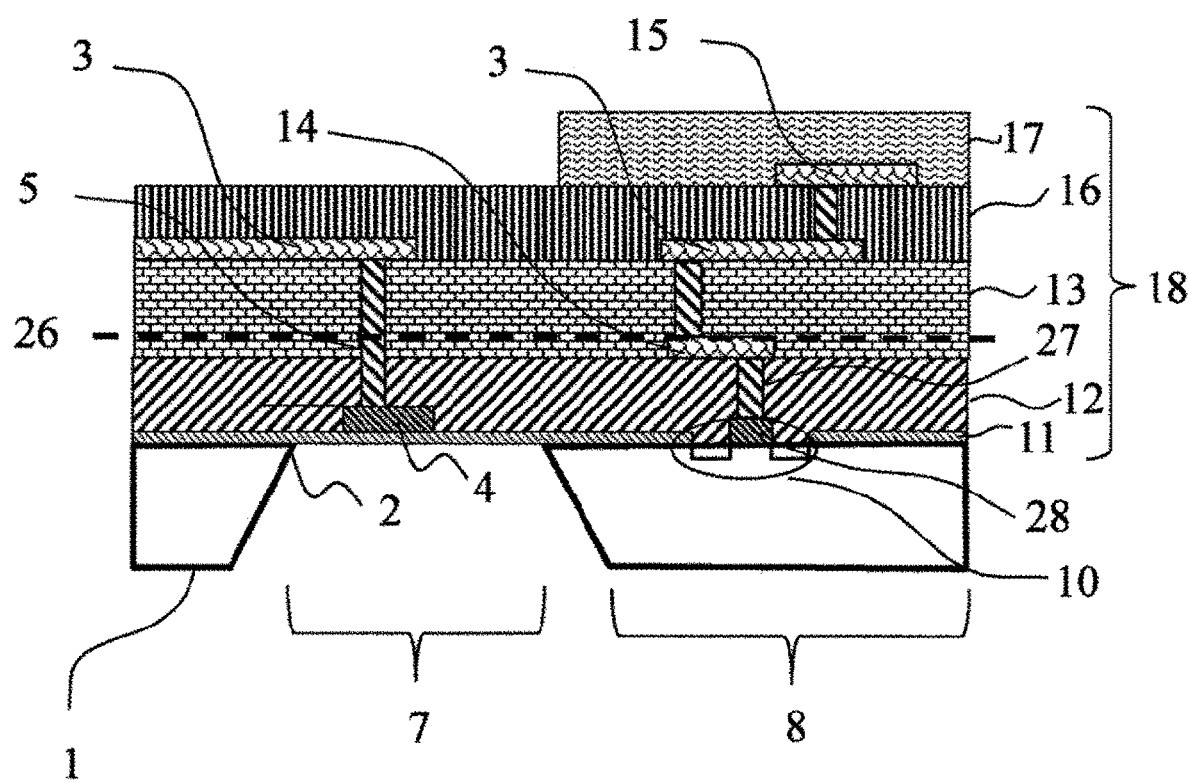
FIG. 7 is a cross-sectional view taken along the line A-A in the first embodiment.

The silicon film 4 is formed on the silicon substrate 1 surface side. When the aluminum film 3 is kept away from the diaphragm end part 2, the generated strain is reduced. Since the silicon film 4 is preferably formed in the same step as the step of forming the transistor 10, the silicon film 4 is provided on the silicon substrate 1 side. As presented in FIG. 7, it is more preferable that the silicon film 4 is arranged on the silicon substrate 1 side with respect to a neutral axis 26 of the diaphragm film, and the aluminum film 3 is arranged on the opposite side (surface side) to the silicon substrate side with respect to the neutral axis 26 of the diaphragm film.

As a further preferable example, the aluminum film 3 in the diaphragm 7 is preferably located on the diaphragm surface from the point of view of strain suppression, but the aluminum film 3 needs to be protected from the external environment, and thus a protection film 16 is formed. Therefore, it is preferable to arrange the aluminum film 3 constituting the thermocouple on the second layer from the surface in terms of both protection of the aluminum film 3 and strain suppression.

Second Embodiment

Figure 3:
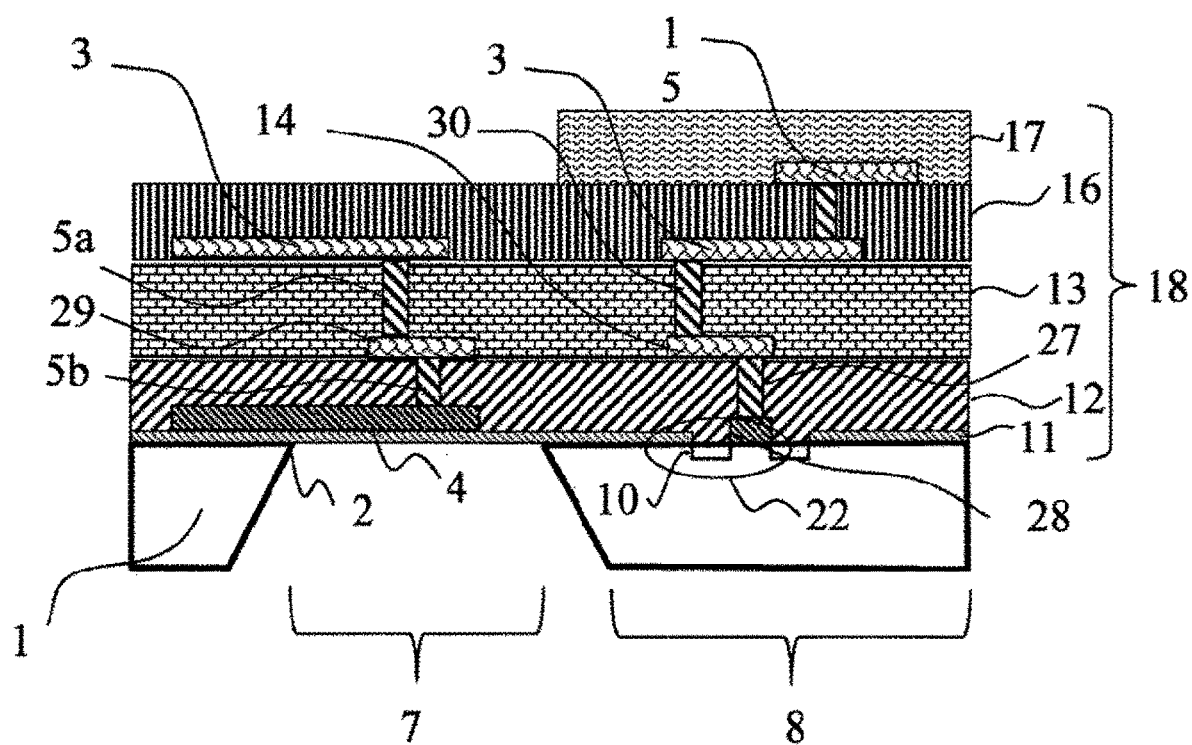
FIG. 3 is a cross-sectional view taken along the line A-A in a second embodiment.

Next, the second embodiment will be described with reference to FIG. 3. The description of the same configuration as in the first embodiment will be omitted.

In the second embodiment, the silicon film 4 and the aluminum film 3 that form the thermocouple are connected via an intermediate aluminum film 29.

The intermediate aluminum film 29 is formed by the same process as that of the second aluminum film 14, and is formed in the same layer as that of the second aluminum film 14. The intermediate aluminum film 14 is provided so as not to cross the vicinity immediately above the diaphragm end part, and is formed so that the influence of the stress generated in the diaphragm end part 2 is small.

The aluminum film 3 and the intermediate aluminum film are connected by a first connection part 5a, and the intermediate aluminum film 29 and the silicon film 4 are connected by a second connection part 5a. Examples of the connection parts 5a and 5b include through-holes.

The connection part 5b and the connection part 27 are formed by the same process, the connection part 5a and a connection part 30 are formed by the same process, and the aspect ratio is made the same by making the heights equal.

In the present embodiment, by forming the intermediate aluminum film 29, the difference in shape between the connection parts 5a and 5b formed in the diaphragm 7 and the connection parts 30 and 27 formed in the circuit part 8 is made smaller than that in the first embodiment. A plurality of metal layers are formed in the circuit part 8. When the aluminum layer 3 is formed on the surface side so as to be kept away from the diaphragm end part 2 as in the present invention, the height of the connection part 5 formed on the diaphragm 7 and the heights of the connection parts 27 and 30 formed on the circuit part are different from each other. In that case, a complicated process is required if through-holes having different heights are formed. However, in the present embodiment, it is possible to form through-holes by a simple process because through-holes having the same height are only required to be formed.

As the example in the present embodiment, the flow rate detection part 21 has a structure of two metal layers, where the intermediate aluminum film 29 is formed in an M1 layer and the aluminum film 3 is formed in an M2 layer, but the present invention is not limited thereto. For example, in the case where the circuit part 8 has a structure of n metal layers, the same effect is achieved by forming the intermediate aluminum film 29 in each of M1 to Mn−1 layers and forming the aluminum film 3 in an Mn layer.

Third Embodiment

Figure 4:
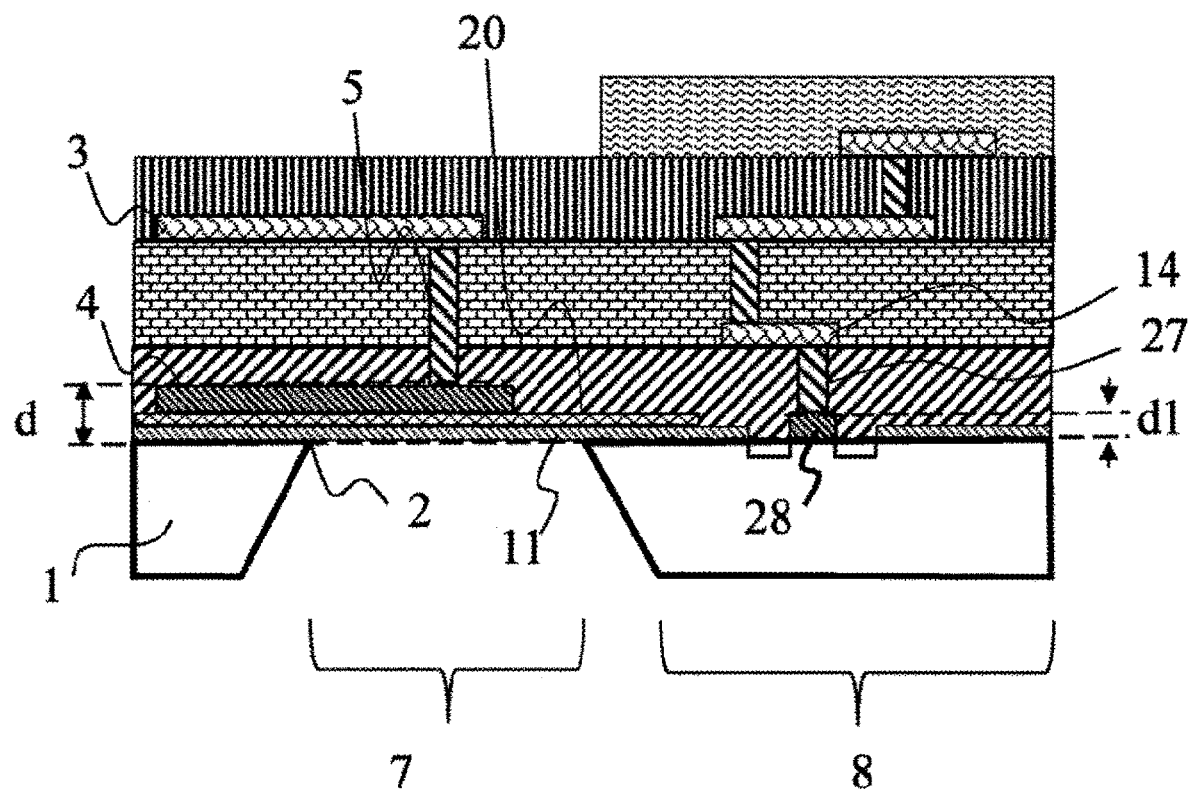
FIG. 4 is a cross-sectional view taken along the line A-A in a third embodiment.

The third embodiment will be described with reference to FIG. 4. The description of the same configuration as in the first embodiment will be omitted.

In the present embodiment, the silicon film 4 is arranged on a sixth insulator film 20 formed on a first insulator film 11. By providing the insulator film 20, the distance d from the surface of the silicon substrate 1 to the surface of the silicon film 4 is made higher than the distance dl from the surface of the silicon substrate 1 to the surface of the silicon film 28.

When the height of the connection part 5 between the silicon film 4 and the aluminum film 3 is equal to or greater than the height of the connection part 27 between the silicon film 28 and the aluminum film 14, the aluminum film 3 is kept away from the diaphragm end part 2, and hence the strain in the aluminum film can be suppressed.

Fourth Embodiment

Figure 6:
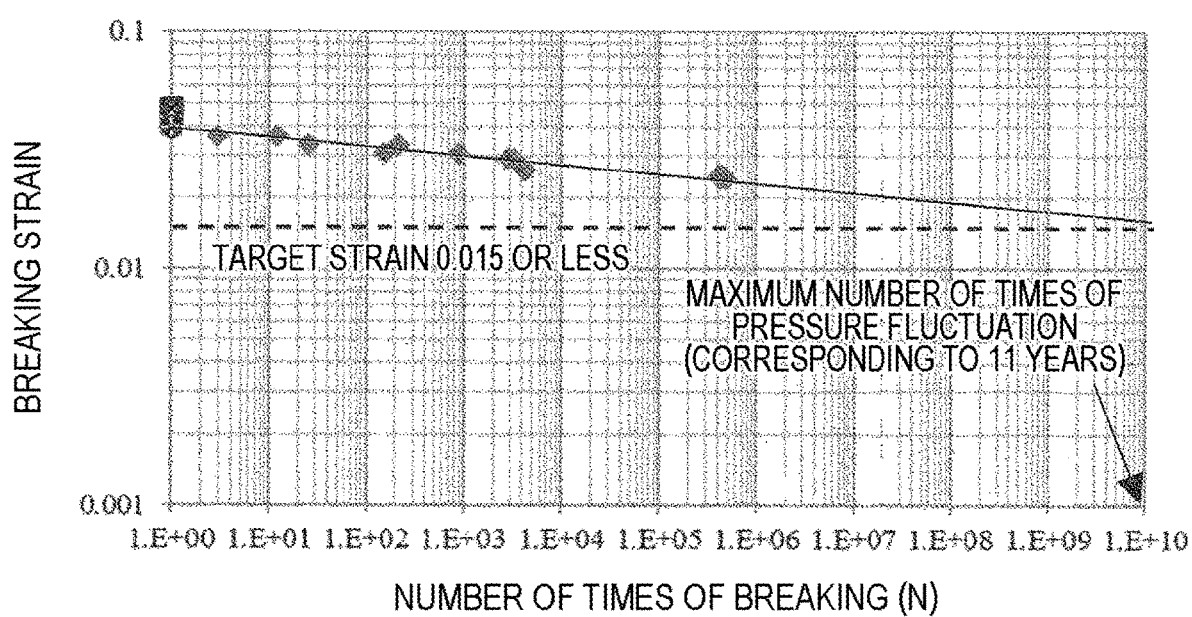
FIG. 6 is a chart presenting a fatigue strength of an aluminum film in a fourth embodiment.

The fourth embodiment will be described with reference to FIG. 6. The description of the same configuration as in the first to third embodiments will be omitted. FIG. 6 presents the fatigue strength (dependence of breaking strain on the number of times of breaking) of the aluminum film having a submicron thickness. In order to obtain a fatigue strength of a normal bulk material, both ends of the material are repeatedly pulled, and the number of times and the pulling force are used. However, in a sample with a submicron thickness, it is difficult to perform independent processing into a single-layer film, and it is necessary to repeatedly pull both ends of the film, and hence it is very difficult to conduct a fatigue test itself. Therefore, a fatigue strength test method for a film with a submicron thickness was developed and the fatigue strength of an aluminum film was measured. The result is presented in FIG. 6.

The frequency of the pulsation pressure from the automobile is considered to be about 100 Hz at the maximum. On an assumption that a driver drives an automobile for five hours a day on a basis of 365 days for 11 years, the number of times of pulsations will be about 1E10. The fatigue strength curve presented in FIG. 6 indicates that it is effective to suppress the generated strain to 0.015 or less in order to prevent the aluminum film from breaking. In other words, the breaking of the aluminum film can be suppressed by designing so as not to exceed this.

Fifth Embodiment

Figure 8:
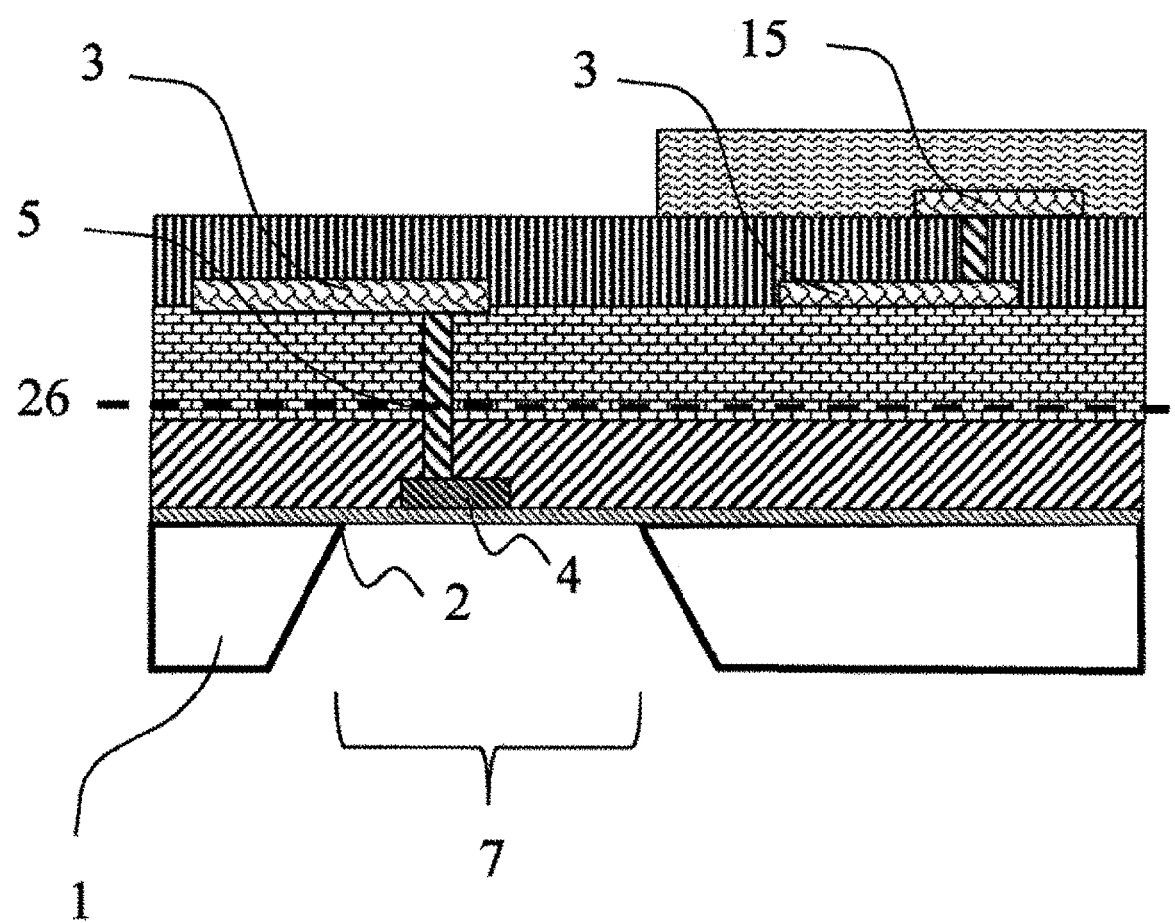
FIG. 8 is a cross-sectional view in a fifth embodiment.

The fifth embodiment of the present invention will be described with reference to FIG. 8. The description of the same configuration as in the first to fourth embodiments will be omitted.

In the fluid flow rate sensor of the present embodiment, the arithmetic circuit 8 is not integrally formed, and another semiconductor element has the function. Also in the present embodiment, the silicon film 4 is provided on the substrate 1 side relative to the neutral axis 26 of the diaphragm 7, and the aluminum film 3 is provided on the opposite side to the substrate 1 relative to the neutral axis 26 at a part crossing the diaphragm end part 2, and hence the aluminum film 3 is separated from the diaphragm end part 2, thereby achieving the same effect as in the first embodiment.

In each of the embodiments described above, the fluid flow rate sensor has been described as an example of the semiconductor element having a thermocouple, but the present invention is not limited thereto, and can be applied to various sensors such as a temperature sensor and a humidity sensor.

The semiconductor element described in each of the embodiments can be applied to a physical quantity measurement device such as a flow rate detection device that measures a flow rate of an internal combustion engine and a humidity measurement device that measures humidity.

REFERENCE SIGNS LIST

1 Silicon substrate
2 Diaphragm end part
3 Aluminum film
4 Silicon film
5 Connection part
5a First connection part
5b Second connection part
7 Diaphragm
8 Circuit part
9 Aluminum pad
10 Diffusion layer
11 First insulator film
12 Second insulator film
13 Third insulator film
14 Second aluminum film
15 Third aluminum film
16 Fourth insulator film
17 Fifth insulator film
18 Laminate part
20 Insulator film
21 Flow rate detection part
22 Transistor
23 Distance from silicon substrate surface to silicon film surface in circuit part
24 Distance from silicon substrate surface to silicon film surface in flow rate sensor part
25 Heating resistor
26 Neutral axis
27 Connection part
28 Silicon film
29 Intermediate aluminum film
30 Connection part

The invention claimed is:

1. A semiconductor element, comprising:
a semiconductor substrate having a cavity part; and
a laminate part laminated on the semiconductor substrate, wherein
the laminate part forms a diaphragm covering the cavity part,
the laminate part has a silicon film and an aluminum film that constitute a thermocouple, and a connection part connecting between the silicon film and the aluminum film, the connection part is provided in the diaphragm,
the silicon film is provided on a substrate side relative to a neutral axis of the diaphragm, and
the aluminum film is provided on an opposite side to a substrate side relative to the neutral axis in a part crossing an end part of the diaphragm.

2. A semiconductor element, comprising:
a semiconductor substrate having a cavity part; and
a laminate part laminated on the semiconductor substrate, wherein
the laminate part forms a diaphragm covering the cavity part,
the laminate part has a silicon film and an aluminum film that constitute a thermocouple, and a connection part connecting between the silicon film and the aluminum film,
the connection part is provided in the diaphragm,
the semiconductor element includes a circuit part having a transistor provided outside the diaphragm, a first aluminum layer formed outside the diaphragm in the laminate part, and a second aluminum layer formed above the first aluminum layer, and
in the aluminum film constituting the thermocouple, a part crossing an end part of the diaphragm is formed above the first aluminum layer.

3. A semiconductor element, comprising:
a semiconductor substrate having a cavity part; and
a laminate part laminated on the semiconductor substrate, wherein
the laminate part forms a diaphragm covering the cavity part,
the laminate part has a silicon film and an aluminum film that constitute a thermocouple, and a connection part connecting between the silicon film and the aluminum film,
the connection part is provided in the diaphragm,
the semiconductor element has a circuit part including a transistor provided outside the diaphragm part, and
a distance D in a thickness direction between the aluminum film and the silicon film at an end part of the diaphragm is larger than a distance D1 in a thickness direction between the transistor and an aluminum film formed immediately above the transistor.

4. The semiconductor element according to claim 1, wherein
an intermediate layer is formed in the diaphragm part, and
the silicon film and the aluminum film are electrically connected via the intermediate layer.

5. The semiconductor element according to claim 2, wherein
an intermediate layer is formed in the diaphragm part, and
the silicon film and the aluminum film are electrically connected via the intermediate layer.

6. The semiconductor element according to claim 3, wherein
an intermediate layer is formed in the diaphragm part, and
the silicon film and the aluminum film are electrically connected via the intermediate layer.

7. The semiconductor element according to claim 2, wherein
an intermediate layer is formed, in the diaphragm, below the aluminum film and above the silicon film,
the connection part has a first connection part and a second connection part,
the aluminum film and the intermediate layer are connected by the first connection part, and
the intermediate layer and the silicon film are connected by the second connection part.

8. The semiconductor element according to claim 3, wherein
an intermediate layer is formed, in the diaphragm, below the aluminum film and above the silicon film,
the connection part has a first connection part and a second connection part,
the aluminum film and the intermediate layer are connected by the first connection part, and
the intermediate layer and the silicon film are connected by the second connection part.

9. The semiconductor element according to claim 7, wherein
the intermediate layer is an aluminum film,
the first and second connection parts are through-holes, and
a height of through-hole connecting between the silicon film and the intermediate layer is equal to a height of through-hole connecting between the transistor and an aluminum film formed immediately above the transistor.

10. The semiconductor element according to claim 1, wherein an aluminum film of the end part of the diaphragm part is provided at a position where a generated strain is equal to or less than 0.015.

11. The semiconductor element according to claim 2, wherein an aluminum film of the end part of the diaphragm part is provided at a position where a generated strain is equal to or less than 0.015.

12. The semiconductor element according to claim 3, wherein an aluminum film of the end part of the diaphragm part is provided at a position where a generated strain is equal to or less than 0.015.

13. The semiconductor element according to claim 1, wherein an aluminum film constituting the thermocouple formed immediately above the end part of the diaphragm is arranged in a second layer from an uppermost layer of the laminate part.

14. The semiconductor element according to claim 2, wherein an aluminum film constituting the thermocouple formed immediately above the end part of the diaphragm is arranged in a second layer from an uppermost layer of the laminate part.

15. The semiconductor element according to claim 3, wherein an aluminum film constituting the thermocouple formed immediately above the end part of the diaphragm is arranged in a second layer from an uppermost layer of the laminate part.

16. A flow rate measurement device, comprising the semiconductor element according to claim 1.

17. A flow rate measurement device, comprising the semiconductor element according to claim 2.

18. A flow rate measurement device, comprising the semiconductor element according to claim 3.

* * * * *